United States Patent [19]

Shimizu

[11] Patent Number: 4,904,499
[45] Date of Patent: Feb. 27, 1990

[54] DIE BONDING METHOD
[75] Inventor: Yasuhiko Shimizu, Yokohama, Japan
[73] Assignee: Kabushiki Kaisha Toshiba, Kawasaki, Japan
[21] Appl. No.: 291,042
[22] Filed: Dec. 28, 1988
[30] Foreign Application Priority Data Dec. 28, 1987 [JP] Japan .............................. 62-332179

[51] Int. Cl.$^4$ ............................................. B32B 31/00
[52] U.S. Cl. ........................... 427/207.1; 156/356; 156/578; 29/740; 118/410; 118/706; 222/52; 222/61
[58] Field of Search ................. 156/64, 356, 578, 299; 29/740; 118/680, 681, 241, 305, 410, 706; 228/56.3; 222/61, 59, 52; 427/207.1

[56] References Cited

U.S. PATENT DOCUMENTS

| | | | |
|---|---|---|---|
| 3,715,258 | 2/1973 | Cunnane | 156/356 |
| 3,785,903 | 1/1974 | Boyer et al. | 156/578 X |
| 3,834,966 | 9/1974 | Kelly | 156/64 X |
| 3,855,034 | 12/1974 | Miller | 156/578 X |
| 3,933,187 | 1/1976 | Marlinski | 156/578 X |
| 4,314,870 | 2/1982 | Ishida et al. | 156/578 X |
| 4,458,412 | 7/1984 | Dean et al. | 29/740 X |
| 4,477,304 | 10/1984 | Westermann | 156/578 X |
| 4,480,983 | 11/1984 | Adams et al. | 425/467 |
| 4,511,421 | 4/1985 | Küehn et al. | 156/354 |
| 4,572,103 | 2/1986 | Engel | 118/410 |
| 4,588,468 | 5/1986 | McGinty et al. | 156/578 X |
| 4,622,239 | 11/1986 | Schoenthaler et al. | 118/410 X |
| 4,661,368 | 4/1987 | Rohde et al. | 118/410 X |
| 4,762,578 | 8/1988 | Burgin, Jr. et al. | 156/64 |
| 4,803,124 | 2/1989 | Kunz | 156/295 X |

Primary Examiner—Michael W. Ball
Assistant Examiner—Jeff H. Aftergut
Attorney, Agent, or Firm—Foley & Lardner, Schwartz, Jeffery, Schwaab, Mack, Blumenthal & Evans

[57] ABSTRACT

A die bonding method using an adhesive agent for fixedly mounting a semiconductor chip on a substrate of a lead frame, wherein a needle for discharging adhesive agent is moved near the substrate to apply the adhesive agent onto the substrate, and thereafter, the needle and substrate are initially moved apart at a first velocity and then at a second velocity greater than the first velocity.

7 Claims, 3 Drawing Sheets

ROTARY ANGLE OF CAM FIXED TO MOTOR 13

DIE BONDING METHOD

FIELD OF THE INVENTION

The present invention relates to a die bonding method, and more particularly to a die bonding method for applying adhesive agent onto substrates of a lead frame, to bond semiconductor chips on the substrates.

BACKGROUND OF THE INVENTION

In manufacturing semiconductor devices, a wafer is subjected to dicing to separate it into respective semiconductor chips (pellets). The separated chips are fixedly attached on substrates of a lead frame at the predetermined positions by means of a conductive adhesive agent (paste), with, for example, polyimide based or epoxy based synthetic resin used as the adhesive agent. An adhesive agent is applied to a substrate before a chip is mounted on the substrate. FIG. 2 shows an example of a die bonding apparatus used for application of an adhesive agent. In FIG. 2, a die bonding apparatus is generally represented by reference numeral 1, and a lead frame to which the adhesive agent is applied using the apparatus, is generally represented by reference numeral 2.

The die bonding apparatus 1 has a stationary bed 3 on which an x-direction movement table 4 is movably mounted in the x-direction. An x-direction drive motor 5 is mounted on the table 4 such that the x-direction movement table 4 is caused to move in the x-direction as an x-direction ball screw (not shown) is rotated by the motor 5. A y-direction movement table 6 is movably mounted in the y-direction on the x-direction movement table 4. A y direction drive motor 7 is mounted on the table 6 such that the y-direction movement table 6 is caused to move in the y-direction as a y-direction ball screw (not shown) which is perpendicular to the x-direction ball screw, is rotated by the motor 7. A z-direction movement guide 11 is fixedly mounted on the y-direction movement table 6. The z-direction movement guide 11 is generally formed in an inverted U-shape. The base of a syringe support 12 is supported by the guide 11 within its groove 11a and so as to be movable in the z-direction (up/down direction). A z-direction drive motor 13 is mounted on the guide 11 for movement of the syringe support 12 in the x-direction. A cam (not shown) of a predetermined shape, is fixedly coupled to the rotary shaft of the motor 13 so that the syringe support 12 moves up and down following the cam surface as the cam rotates. A syringe 15 is supported at the distal portion of the syringe support 12. The syringe 15 comprises a container 15b for accommodating therein the adhesive agent and a needle 15a from which the adhesive agent is discharged. In order to discharge the adhesive agent from the needle 15a, an air on/off type dispenser 16 is coupled to the container 15b.

FIG. 2A partially shows the detail of FIG. 2. As seen from FIG. 2A, the syringe 15 can be moved up or down within the support 12 by loosening a screw 12a so that the clearance between the substrate 2a and the tip of the needle 15a, with the support 12 moved to the lowest position, can be adjusted.

A lead frame 2, to which the adhesive agent is applied with the die bonding apparatus 1 constructed as above, has a plurality of substrates 2a juxtaposed in the x-direction as seen in FIG. 2. A semiconductor chip (not shown) prepared beforehand is mounted on and fixed to each substrate 2a. Bonding pads of a chip fixed on each substrate 2a are thereafter connected to lead wires (not shown) of the lead frame 2 by means of bonding wires.

Application of the adhesive agent to a substrate 2a by using the die bonding apparatus 1 shown in FIG. 2, is carried out in the following manner. With the syringe 15 set at a high position, position alignment in the x- and y-directions of the syringe 15 is made using the x- and y-direction drive motors 5 and 6. Upon completion of position alignment, the syringe 15 is moved downward using the z-direction drive motor 13 to discharge the adhesive agent from the needle 15a and apply it to the substrate 2a. Thereafter, the syringe 15 is moved upward using the z-direction drive motor 13. At the same time, the lead frame is moved in the x-direction with a transportation apparatus (not shown) so that a new substrate 2a next to the adhesive applied substrate 2a is positioned just below the needle 15a of the syringe 15. The above adhesive agent application operation is thus repeated. Semiconductor chips are sequentially mounted on and fixed to the upper surfaces of the substrates 2a applied with the adhesive agent, by means of a semiconductor feeding means (not shown) positioned behind the syringe 15 in the x-direction as seen in FIG. 2.

FIG. 3 is an up/down displacement chart illustrating the up/down movement of the needle 15a during one cycle of adhesive agent application. As shown in this chart, the displacement S of the needle 15a (or syringe 15) during one cycle of up/down movement corresponds to the rotation, by an angle $\theta$, of the cam fixed on the rotary shaft of the z-direction drive motor 13. In particular, rotation by an angle $\theta_a$ of the cam causes the needle 15a to move downward, and further rotation by an angle $\theta_c$ causes the needle 15a to hold the lowered position while the adhesive agent is applied, and following rotation by an angle $\theta_b$ causes the needle 15a to move upward. The up movement and down movement of the needle 15a are quickly carried out in accordance with one cycloidal curve.

In the above case, the upward movement of the needle 15a is quickly carried out upon rotation by an angle $\theta_b$ in accordance with one cycloidal curve. The various types of resins used as an adhesive agent essentially have high viscosity characteristics. Therefore, if the needle 15a is raised quickly as described above after it has discharged the adhesive agent onto the substrate 2a, stringing of the adhesive agent A will occur as shown in FIG. 4. The amount of stringing of the adhesive agent is dependent on what material is used as adhesive agent, i.e., on the viscosity and other characteristics of the particular adhesive agent. If the adhesive agent having a large amount of stringing is used, the strung adhesive agent may fall down onto an area other than a predetermined area for application of the adhesive agent.

SUMMARY OF THE INVENTION

The present invention has been made in consideration of the above circumstances. It is therefore an object of the present invention to provide a die bonding method capable of preventing the adhesive agent from stringing after the application to a substrate.

According to the present invention, in a die bonding method wherein the adhesive agent with which a semiconductor chip is bonded to a substrate of a lead frame, is discharged from a needle of a die bonding apparatus onto the substrate, thereafter the substrate and needle are relatively moved apart, and the above operation is repeated for each substrate of the lead frame, the die bonding method comprises: after discharge of the adhesive agent, initially using a first velocity for moving the substrate and needle apart; and thereafter using a second velocity for moving them further apart, the second velocity being greater than the first velocity.

In operation, the adhesive agent is discharged from the needle onto a substrate. Thereafter, the needle and the substrate are moved apart at a low first velocity. Therefore, stringing of the adhesive agent is suppressed with ready separation of the adhesive agent toward the needle and substrate sides. The needle and the substrate are then moved apart further at a second velocity greater than the first velocity. Discharge of the adhesive agent onto a substrate can be completed without lengthening of the cycle operation time, and with the suppression of stringing of the adhesive agent. Therefore, various types of materials can be used as the adhesive agent.

According to the present invention, adhesive agent can be discharged onto a substrate without lengthening the cycle operation time and with the suppression of stringing of the adhesive agent to therefore allowing a high production efficiency and semiconductor devices with high reliability.

DESCRIPTION OF THE PREFERRED EMBODIMENT

Figure 1:
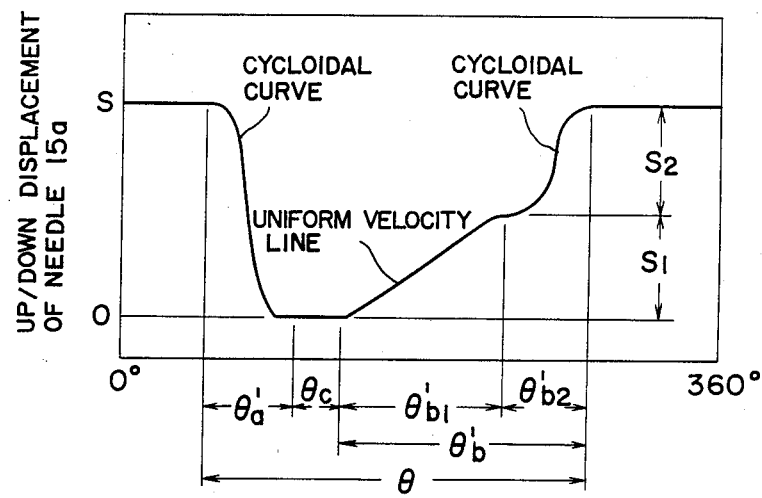
FIG. 1 is a needle up/down displacement chart showing the up/down movement of a needle, according to an embodiment of this invention.
Figure 3:
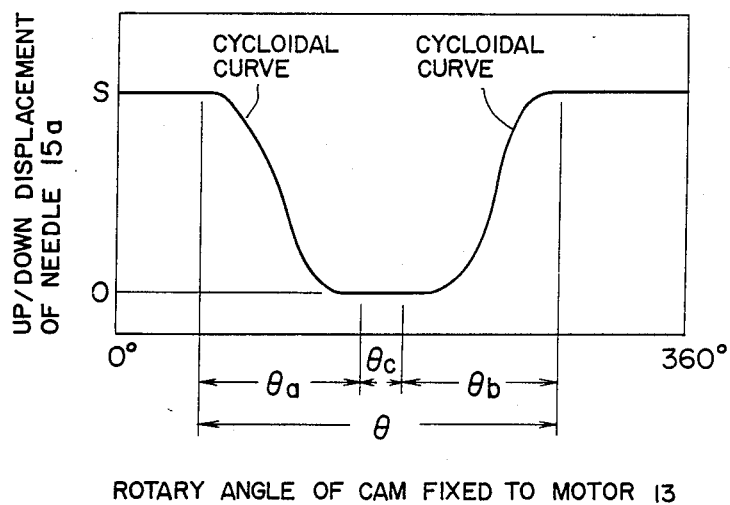
FIG. 3 is a needle up/down displacement chart showing the up/down movement of a needle, according to the prior art.
Figure 4:
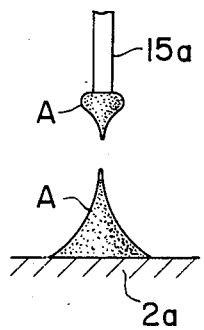
FIG. 4 illustrates stringing of the adhesive gent as encountered in the prior art method.

FIG. 1 is a needle displacement chart showing the up/down movement of the needle 15a, and is used to explain an embodiment of this invention. As can be seen from FIG. 1, one cycle of the up/down movement of the needle 15a is performed upon uniform rotation by an angle $\theta$ of the cam fixed on the rotary shaft of the motor 13. This angle $\theta$ is equal to the angle $\theta$ used in the conventional method shown in FIG. 3 for rotation of the cam necessary for one cycle of the up/down movement of the needle 15a. The downward movement of the needle 15a is carried out by a rotation of the cam by an angle $\theta_a'$ smaller than the angle $\theta_a$ shown in FIG. 3. The displacement curve of the needle 15a moving downward is a cycloidal curve. The upward movement of the needle 15a is carried out by rotation of the cam by an angle $\theta_b'$ larger than the angle $\theta_b$ shown in FIG. 3. Upon rotation by an angle $\theta_{b1}'$ at the leading portion of the angle $\theta_b'$, it is so arranged that the needle 15a is moved upward at an uniform velocity to the height S1 at the midway of displacement S, to trace a uniform velocity curve. Namely, this upward movement velocity is set at slower than that shown in FIG. 3 so that the amount of stringing of the conductive adhesive agent becomes less to the extent that it is readily cut and separated toward the needle 15a and substrate 2a sides so as not to fall down onto the undesired area (the area where the adhesive agent should not be applied) of the substrate 2a. Upon rotation by an angle $\theta_{b2}'$ at the trailing portion of the angle $\theta_b'$, it is so arranged that the needle 15a is rapidly moved further upward by the remaining height S2 to trace a steeper $\theta$ cycloidal curve. This is because the upward movement in this case is performed after the adhesive agent has been cut and separated, thus allowing such a high velocity. With the above arrangement, it becomes possible to discharge and apply the adhesive agent onto a substrate 2a without any stringing occurring. Because of this, it is possible to use adhesive agents of materials that could not be used because of stringing occurring with conventional methods.

In addition, the rotation angle $\theta$ of the cam necessary for the up/down movement of the needle 15a through displacement S is the same as those for both the present (FIG. 1) and conventional (FIG. 3) methods. Therefore, in the above embodiment of this invention, one cycle of discharge and application operation of an adhesive agent can be performed within the same time as that in the conventional method.

The cam (or z-direction drive motor 13) is made to rotate at a uniform velocity in the above embodiment. However, instead of the embodiment cam, a unfirom velocity cam may be used by rotating it at a variable velocity by motor 13 to obtain the same displacement curve as shown in FIG. 1.

Figure 1A:
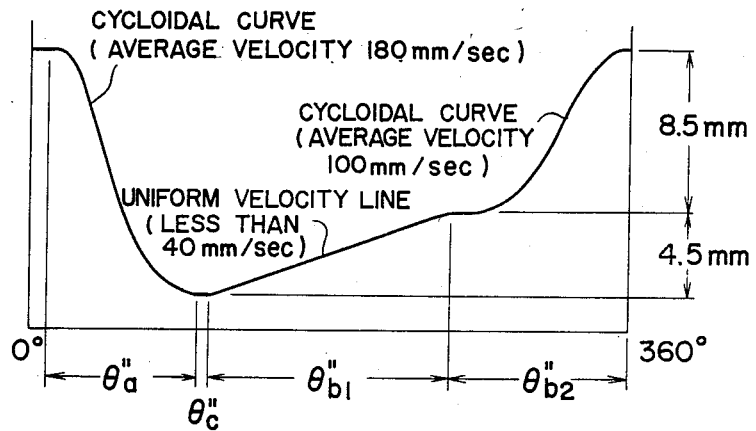
FIG. 1A is a needle up/down displacement chart showing a test result for this invention.
Figure 2:
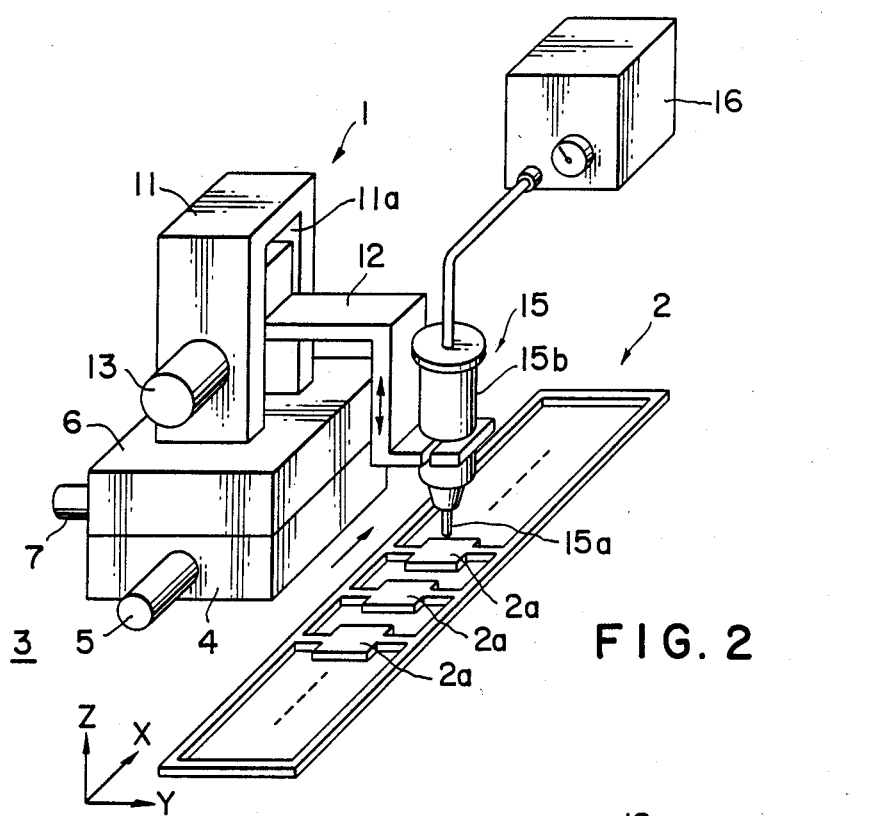
FIG. 2 is a perspective view of a die bonding apparatus.
Figure 2A:
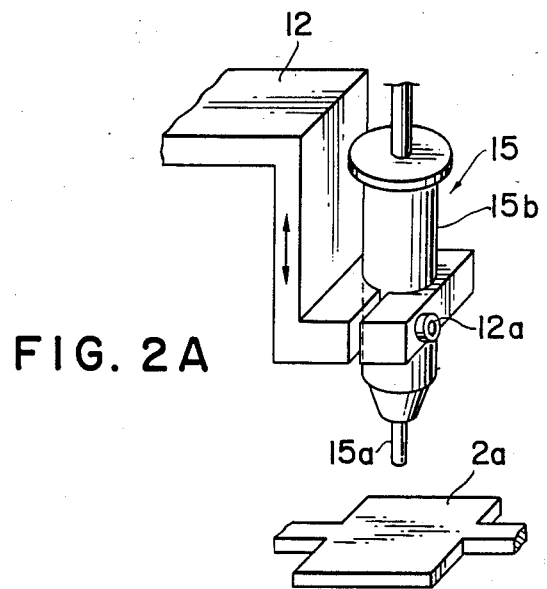
FIG. 2A is a partial, enlarged view of Fig. 2.

FIG. 1A is a cam timing chart (needle up/down displacement chart) illustrating the results of tests carried out by the inventors for this invention. In the experiment, epoxy resin having a viscosity of 100 to 300 PS was used. As seen from this timing chart, while rotating the cam by an angle $\theta_a''$, the needle was first moved downward by 13 mm at a velocity (average velocity of 180 mm/sec) tracing a cycloidal curve. Next, while rotating the cam by an angle $\theta_c''$, the needle was held at that position. Thereafter, while rotating the cam by an angle $\theta_{p1}''$, the needle was moved upward by 4.5 mm at a velocity less than 40 mm/sec. tracing a uniform velocity line. Lastly, while rotating the cam by an angle $\theta_b''$, the needle was moved upward by 8.5 mm at a velocity (average velocity of 100 mm/sec) tracing a cycloidal curve. By moving the needle as above, it was possible to make the amount of resin stringing small and to prevent unnecessary resin from falling down onto the substrate.

What is claimed is:

1. In a die bonding method wherein an adhesive agent with which a semiconductor chip is bonded to a substrate of a lead frame, is discharged from a needle of a die bonding apparatus to the substrate, thereafter the substrate and needle are moved apart and the above operation is repeated for each substrate of the lead frame, said die bonding method comprising: after discharge of said adhesive agent, initially using a first velocity for moving said substrate and needle apart; and thereafter using a second velocity for moving them apart, said second relative movement velocity being greater than said first relative movement velocity.

2. A die bonding method according to claim 1, wherein said first velocity is a uniform velocity.

3. A die bonding method according to claim 1, wherein said first velocity is a low velocity at which said adhesive agent can be prevented from stringing and falling onto an area of said substrate where said adhesive agent should not be applied.

4. A die bonding method according to claim 1, wherein the up/down movement of said needle is realized through rotation of a cam at a uniform velocity.

5. A die bonding method according to claim 1, wherein the up/down movement of said needle is realized through rotation of a cam at a variable velocity.

6. A die bonding method according to claim 1, wherein a resin having a viscosity of from 100 to 300 PS is used as said adhesive agent, and said first velocity is lower than 40 mm/sec.

7. A die bonding method according to claim 6, wherein said second velocity has an average velocity of 100 mm/sec.

* * * * *